United States Patent
Choi et al.

(10) Patent No.: US 12,185,572 B2
(45) Date of Patent: Dec. 31, 2024

(54) DISPLAY DEVICE WITH A PLURALITY OF INORGANIC ENCAPSULATION LAYERS

(71) Applicant: Samsung Display Co., Ltd., Yongin-si (KR)

(72) Inventors: Chul Hyun Choi, Cheonan-si (KR); Min Jae Kim, Yongin-si (KR); Kyung Hee Lee, Asan-si (KR); Suk Jin Lee, Asan-si (KR); In Hwa Lee, Asan-si (KR); Hyuk Sang Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 547 days.

(21) Appl. No.: 17/452,546

(22) Filed: Oct. 27, 2021

(65) Prior Publication Data
US 2022/0140290 A1 May 5, 2022

(30) Foreign Application Priority Data
Nov. 3, 2020 (KR) .................. 10-2020-0145171

(51) Int. Cl.
| | | |
|---|---|---|
| H01L 51/52 | (2006.01) | |
| H01L 27/32 | (2006.01) | |
| H10K 50/844 | (2023.01) | |
| H10K 50/858 | (2023.01) | |
| H10K 59/12 | (2023.01) | |
| H10K 102/00 | (2023.01) | |

(52) U.S. Cl.
CPC ......... *H10K 50/858* (2023.02); *H10K 50/844* (2023.02); *H10K 59/12* (2023.02); *H10K 2102/351* (2023.02)

(58) Field of Classification Search
CPC .... H10K 50/858; H10K 50/844; H10K 59/12; H10K 2102/351
See application file for complete search history.

(56) References Cited

U.S. PATENT DOCUMENTS

| | | |
|---|---|---|
| 9,431,634 B2 | 8/2016 | Song |
| 9,627,647 B2 | 4/2017 | Kim et al. |
| 9,843,023 B2 | 12/2017 | Cho et al. |
| 9,966,567 B2 | 5/2018 | Kim et al. |
| 10,236,474 B2 | 3/2019 | Song |
| 10,553,651 B2 | 2/2020 | Yim et al. |

(Continued)

FOREIGN PATENT DOCUMENTS

| | | |
|---|---|---|
| KR | 10-2006-0032089 A | 4/2006 |
| KR | 10-2014-0033867 A | 3/2014 |

(Continued)

*Primary Examiner* — Tracie Y Green
(74) *Attorney, Agent, or Firm* — Lewis Roca Rothgerber Christie LLP

(57) ABSTRACT

A display device includes a substrate; a light-emitting element on the substrate; a capping layer on the light-emitting element; a first inorganic encapsulation layer on the capping layer; an organic encapsulation layer on the first inorganic encapsulation layer; and a second inorganic encapsulation layer on the organic encapsulation layer. The first inorganic encapsulation layer includes a first sub-inorganic encapsulation layer between the capping layer and the organic encapsulation layer, and a second sub-inorganic encapsulation layer between the first sub-inorganic encapsulation layer and the organic encapsulation layer.

20 Claims, 9 Drawing Sheets

(56) References Cited

U.S. PATENT DOCUMENTS

| | | | |
|---|---|---|---|
| 10,811,634 B2 | 10/2020 | Song et al. | |
| 10,879,494 B2 | 12/2020 | Song | |
| 11,258,046 B2 | 2/2022 | Song et al. | |
| 11,349,101 B2 | 5/2022 | Song | |
| 11,871,613 B2 | 1/2024 | Song | |
| 2016/0141553 A1* | 5/2016 | Lee | H10K 59/8791 |
| | | | 257/40 |
| 2017/0125497 A1* | 5/2017 | Kim | H10K 50/844 |
| 2018/0040847 A1* | 2/2018 | Lee | H10K 50/858 |
| 2018/0287093 A1* | 10/2018 | Lee | H10K 50/822 |

FOREIGN PATENT DOCUMENTS

| | | |
|---|---|---|
| KR | 10-2014-0064349 A | 5/2014 |
| KR | 10-2016-0036722 A | 4/2016 |
| KR | 10-2016-0082864 A | 7/2016 |
| KR | 10-2018-0016694 A | 2/2018 |
| KR | 10-2018-0051702 A | 5/2018 |
| KR | 10-2019-0015682 A | 2/2019 |
| KR | 10-2019-0076090 A | 7/2019 |

* cited by examiner

DISPLAY DEVICE WITH A PLURALITY OF INORGANIC ENCAPSULATION LAYERS

CROSS-REFERENCE TO RELATED APPLICATION

This application claims priority to and the benefit of Korean Patent Application No. 10-2020-0145171 filed on Nov. 3, 2020 in the Korean Intellectual Property Office (KIPO), the entire disclosure of which is incorporated by reference herein.

BACKGROUND

1. Field

The present disclosure relates to a display device.

2. Description of Related Art

Recently, display devices have been used in a diverse range of applications. In addition, as a thickness of a display device becomes thinner, a weight of the display device becomes lighter, and a range of use thereof becomes wider, research on a display device that may be used in various fields is being continuously conducted.

The display device may include light-emitting elements and an encapsulation member that seals the light-emitting elements to protect them from outside air or moisture.

In a case of a top emission type display device, light emitted from a light-emitting element (or a display element) is recognized by a user through a thin film encapsulation layer, but a change in visibility may occur according to the user's viewing angle depending on a structure of the thin film encapsulation layer through which the light passes. Specifically, it is desirable to visually recognize an image in white at full light emission, but due to the structure of the thin film encapsulation layer, at full light emission, a change in visibility to another color occurs instead of white, and as the viewing angle becomes larger, a degree of such a change in visibility may become larger.

SUMMARY

Aspects of one or more embodiments of the present disclosure are directed towards a display device in which a change in visibility according to a user's viewing angle due to a structure of a thin film encapsulation layer is reduced.

According to an embodiment, a display device includes: a substrate; a light-emitting element on the substrate; a capping layer on the light-emitting element; a first inorganic encapsulation layer on the capping layer; an organic encapsulation layer on the first inorganic encapsulation layer; and a second inorganic encapsulation layer on the organic encapsulation layer. The first inorganic encapsulation layer includes: a first sub-inorganic encapsulation layer between the capping layer and the organic encapsulation layer; and a second sub-inorganic encapsulation layer between the first sub-inorganic encapsulation layer and the organic encapsulation layer. A thickness of the second sub-inorganic encapsulation layer is 3 times to 30 times a thickness of the first sub-inorganic encapsulation layer and/or a thickness of the capping layer. A refractive index of the capping layer is larger than a refractive index of the first sub-inorganic encapsulation layer. A refractive index of the second sub-inorganic encapsulation layer is larger than the refractive index of the first sub-inorganic encapsulation layer. The refractive index of the capping layer is 1.3 times to 1.9 times the refractive index of the first sub-inorganic encapsulation layer. The refractive index of the second sub-inorganic encapsulation layer is 1.01 times to 1.47 times the refractive index of the first sub-inorganic encapsulation layer.

The first sub-inorganic encapsulation layer may be directly on the capping layer. The second sub-inorganic encapsulation layer may be directly on the first sub-inorganic encapsulation layer.

The refractive index of the capping layer may be 1.7 to 2.4.

The refractive index of the first sub-inorganic encapsulation layer may be 1.3 to 1.62.

The refractive index of the second sub-inorganic encapsulation layer may be 1.64 to 1.9.

The thickness of the capping layer may be 500 nm to 1,500 nm.

The thickness of the first sub-inorganic encapsulation layer may be 500 nm to 1,500 nm.

The thickness of the second sub-inorganic encapsulation layer may be 5,000 nm to 15,000 nm.

The first inorganic encapsulation layer further may include a third sub-inorganic encapsulation layer between the second sub-inorganic encapsulation layer and the organic encapsulation layer. The refractive index of the second sub-inorganic encapsulation layer may be larger than a refractive index of the third sub-inorganic encapsulation layer.

The third sub-inorganic encapsulation layer may be directly on the second sub-inorganic encapsulation layer.

The refractive index of the second sub-inorganic encapsulation layer may be 1.01 times to 1.47 times the refractive index of the third sub-inorganic encapsulation layer.

The refractive index of the third sub-inorganic encapsulation layer may be 1.3 to 1.62. A thickness of the third sub-inorganic encapsulation layer may be 500 nm to 1,500 nm.

The second inorganic encapsulation layer may include a fourth inorganic encapsulation layer on the organic encapsulation layer, an upper inorganic encapsulation layer spaced from the organic encapsulation layer with the fourth inorganic encapsulation layer interposed therebetween, and a fifth inorganic encapsulation layer spaced from the fourth inorganic encapsulation layer with the upper inorganic encapsulation layer interposed therebetween. A refractive index of the organic encapsulation layer may be larger than a refractive index of the fourth inorganic encapsulation layer. A refractive index of the upper inorganic encapsulation layer may be larger than each of the refractive index of the fourth inorganic encapsulation layer and a refractive index of the fifth inorganic encapsulation layer.

The first sub-inorganic encapsulation layer and the second sub-inorganic encapsulation layer of the first inorganic encapsulation layer may be alternately arranged with each other.

According to an embodiment, a display device includes: a substrate; a light-emitting element on the substrate; a capping layer on the light-emitting element; a first inorganic encapsulation layer on the capping layer; an organic encapsulation layer on the first inorganic encapsulation layer; and a second inorganic encapsulation layer on the organic encapsulation layer. The first inorganic encapsulation layer includes: a first sub-inorganic encapsulation layer between the capping layer and the organic encapsulation layer; a second sub-inorganic encapsulation layer between the first sub-inorganic encapsulation layer and the organic encapsulation layer; and a third sub-inorganic encapsulation layer between the second sub-inorganic encapsulation layer and the organic encapsulation layer. A refractive index of the capping layer is larger than a refractive index of the first sub-inorganic encapsulation layer. A refractive index of the second sub-inorganic encapsulation layer is larger than each of the refractive index of the first sub-inorganic encapsulation layer and a refractive index of the third sub-inorganic encapsulation layer. The first sub-inorganic encapsulation layer, the second sub-inorganic encapsulation layer, and the third sub-inorganic encapsulation layer contain silicon, nitrogen, and oxygen, respectively. A content of nitrogen relative to a content of silicon in the first sub-inorganic encapsulation layer is 0.25 to 0.45. A content of oxygen relative to the content of silicon in the first sub-inorganic encapsulation layer is 0.75 to 0.80. A content of nitrogen relative to a content of silicon in the second sub-inorganic encapsulation layer is 0.55 to 0.70. A content of oxygen relative to the content of silicon in the second sub-inorganic encapsulation layer is 0.25 to 0.35. A content of nitrogen relative to a content of silicon in the third sub-inorganic encapsulation layer is 0.45 to 0.55. A content of oxygen relative to the content of silicon in the third sub-inorganic encapsulation layer is 0.55 to 0.70.

The first sub-inorganic encapsulation layer may be directly on the capping layer. The second sub-inorganic encapsulation layer may be directly on the first sub-inorganic encapsulation layer. The third sub-inorganic encapsulation layer may be directly on the second sub-inorganic encapsulation layer.

A thickness of the second sub-inorganic encapsulation layer may be 3 times to 30 times a thickness of the first sub-inorganic encapsulation layer and/or a thickness of the capping layer. The thickness of the capping layer may be 500 nm to 1,500 nm. The thickness of the first sub-inorganic encapsulation layer may be 500 nm to 1,500 nm. The thickness of the second sub-inorganic encapsulation layer may be 5,000 nm to 15,000 nm. A thickness of the third sub-inorganic encapsulation layer may be 500 nm to 1,500 nm.

According to an embodiment, a display device includes: a substrate; a light-emitting element on the substrate; a capping layer on the light-emitting element; a first inorganic encapsulation layer on the capping layer; an organic encapsulation layer on the first inorganic encapsulation layer; and a second inorganic encapsulation layer on the organic encapsulation layer. The first inorganic encapsulation layer includes: a first sub-inorganic encapsulation layer between the capping layer and the organic encapsulation layer; and a second sub-inorganic encapsulation layer between the first sub-inorganic encapsulation layer and the organic encapsulation layer. A refractive index of the capping layer is 1.7 to 2.4. A refractive index of the first sub-inorganic encapsulation layer is 1.3 to 1.62. A refractive index of the second sub-inorganic encapsulation layer is 1.64 to 1.9. A change amount of a second component ($\Delta v'$) and a change amount of a first component ($\Delta u'$) are 0 at a viewing angle of 0°. The change amount of the second component ($\Delta v'$) has a positive value and the change amount of the first component ($\Delta u'$) has a negative value at a viewing angle of 60°.

The change amount of the first component ($\Delta u'$) at the viewing angle of 60° may be smaller in absolute value than the change amount of the first component ($\Delta u'$) at a viewing angle of 45°.

The change amount of the second component ($\Delta v'$) at the viewing angle of 60° may be smaller in absolute value than the change amount of the second component ($\Delta v'$) at the viewing angle of 45°.

Additional details according to one or more embodiments of the present disclosure are included in the following detailed description and drawings.

DETAILED DESCRIPTION

Figure 1:
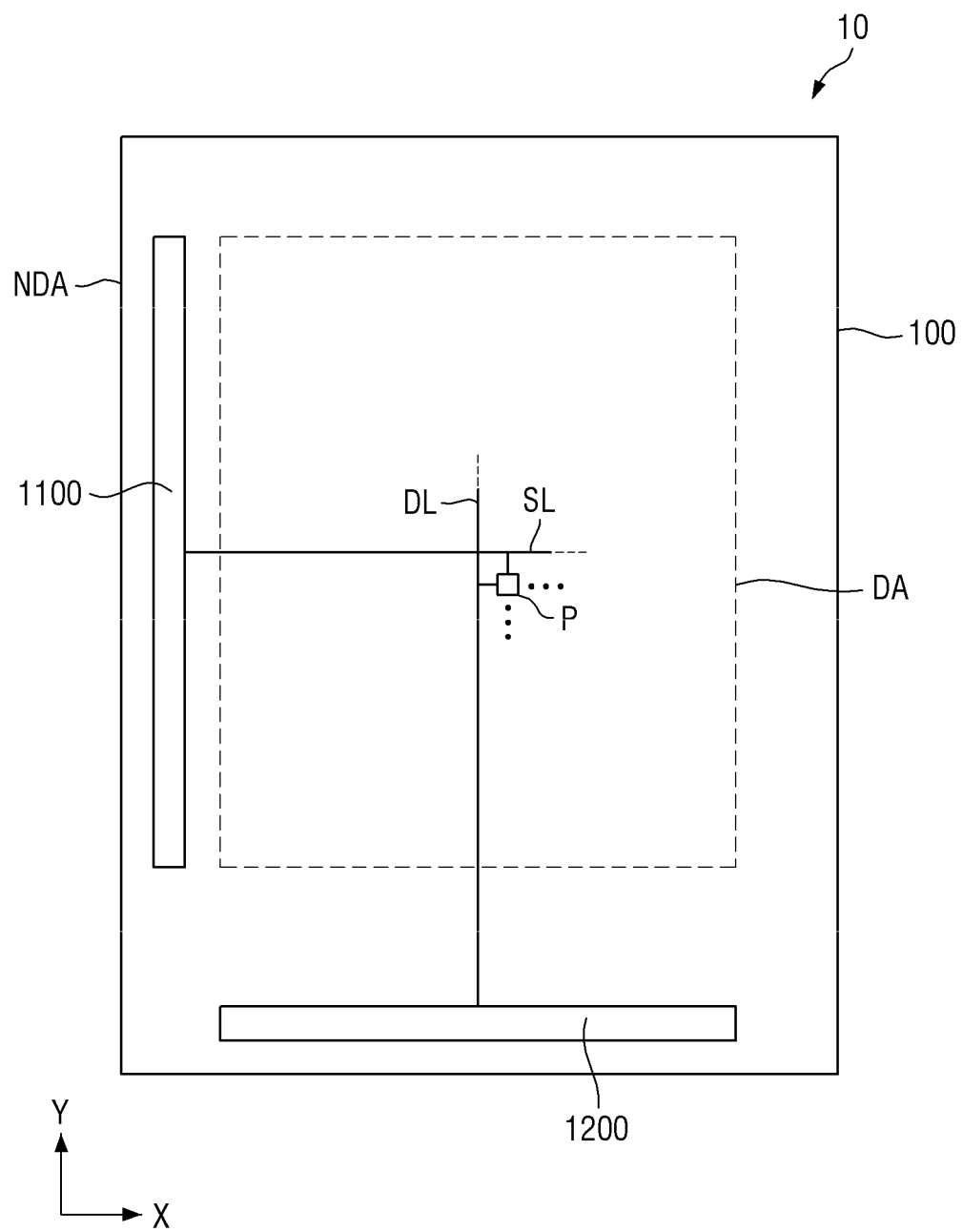
FIG. 1 is a plan view schematically showing a display device according to an embodiment.

The present disclosure may be subjected to various transformations and may have several embodiments, and thus specific embodiments will be illustrated in the drawings and described in the detailed description in more detail. The effects and features of the present disclosure, and methods of accomplishing the same will become apparent with reference to the following detailed description and the accompanying drawings. However, the present disclosure is not limited to the embodiments disclosed herein, and may be embodied in various forms.

Hereinafter, the embodiments of the present disclosure will be described in more detail with reference to the accompanying drawings. In the following description with the accompanying drawings, the same or corresponding components may be designated by the same reference numerals, and repeated description thereof may not be repeated. In the following embodiments, when a part such as a film, region, component, etc. is on another part, it includes not only a case in which the part is directly on the other part but also a case in which one or more other films, regions, and/or components are intervened therebetween.

In the following embodiments, when films, regions, components, etc. are connected, it includes not only a case in which films, regions, and components are directly connected but also a case in which one or more other films, regions, and components are intervened and indirectly connected between films, regions, and component. For example, when films, regions, and components, etc. are connected electrically in the present specification, it includes not only a case in which films, regions, components, etc. are directly electrically connected but also a case in which one or more other films, regions, and components are intervened and indirectly electrically connected between films, regions, and components.

In the following embodiments, an x-axis, a y-axis and a z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

"About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system).

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view schematically showing a display device according to an embodiment.

Referring to FIG. 1, a display device 10 may include a display area DA and a non-display area NDA adjacent to the display area DA. The display device 10 may include a plurality of pixel areas P disposed in the display area DA. A display element capable of emitting light of a color (e.g., a set or predetermined color) may be disposed in each pixel area P, and the display element may be connected to a scan line SL and a data line DL. FIG. 1 may be understood as a shape of a substrate 100 of the display device 10. For example, it may be understood that the substrate 100 has the display area DA and the non-display area NDA.

A scan driver 1100 for providing a scan signal to each pixel area P via the scan line SL, a data driver 1200 for providing a data signal to the display element provided in each pixel area P via the data line DL, and a main power line for providing first and second power voltages may be disposed in the non-display area NDA.

FIG. 1 shows that the data driver 1200 is disposed on the substrate 100, but as another embodiment, the data driver 1200 may be disposed on a flexible printed circuit board (FPCB) electrically connected to a pad disposed on one side of the display device 10.

The display device 10 according to the embodiment of the present disclosure may include an organic light-emitting display, an inorganic light-emitting display, a quantum dot display, and/or the like. Hereinafter, as the display device according to the embodiment of the present disclosure, the organic light-emitting display device will be described as an example, but the display device of the present disclosure is not limited thereto, and features to be described below may be applied to various types (kinds) of display devices as described above.

Figure 2:
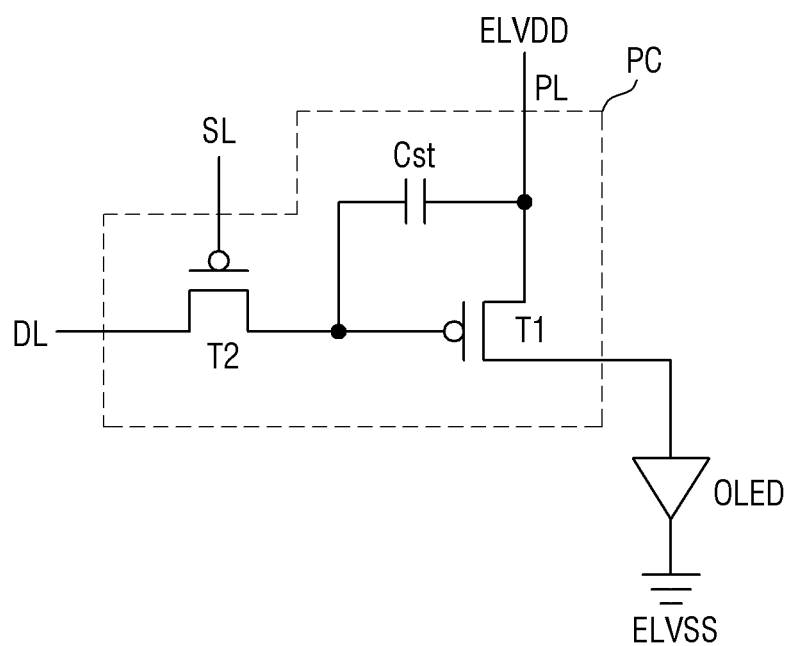
FIG. 2 shows a display element disposed in any pixel area of a display device according to an embodiment and a pixel circuit connected thereto.

FIG. 2 shows a display element disposed in any pixel area of a display device according to an embodiment and a pixel circuit connected thereto.

Referring to FIG. 2, the display element may include a light-emitting element. The light-emitting element may include an organic light-emitting diode OLED. The organic light-emitting diode OLED may be connected to a pixel circuit PC. The pixel circuit PC may include a first thin film transistor T1, a second thin film transistor T2, and a storage capacitor Cst. For example, the organic light-emitting diode OLED may emit red light, green light, or blue light, or may emit red light, green light, blue light, or white light.

The second thin film transistor T2 is a switching thin film transistor, which is connected to the scan line SL and the data line DL, and may transfer a data voltage input from the data line DL according to a switching voltage input from the scan line SL to the first thin film transistor T1. The storage capacitor Cst is connected to the second thin film transistor T2 and a driving voltage line PL, and may store a voltage corresponding to a difference between a voltage received from the second thin film transistor T2 and a first power voltage ELVDD supplied to the driving voltage line PL.

The first thin film transistor T1 is a driving thin film transistor, which is connected to the driving voltage line PL and the storage capacitor Cst, and may control a driving current flowing from the driving voltage line PL to the organic light-emitting diode OLED in response to a voltage value stored in the storage capacitor Cst. The organic light-emitting diode OLED may emit light having a set brightness (e.g., a predetermined brightness) by the driving current. A counter electrode (e.g., a cathode) of the organic light-emitting diode OLED may receive a second power voltage ELVSS.

FIG. 2 illustrates that the pixel circuit PC includes two thin film transistors and one storage capacitor, but in another embodiment, the number of thin film transistors or the number of storage capacitors may be changed variously in a suitable manner according to a design of the pixel circuit PC.

Figure 3:
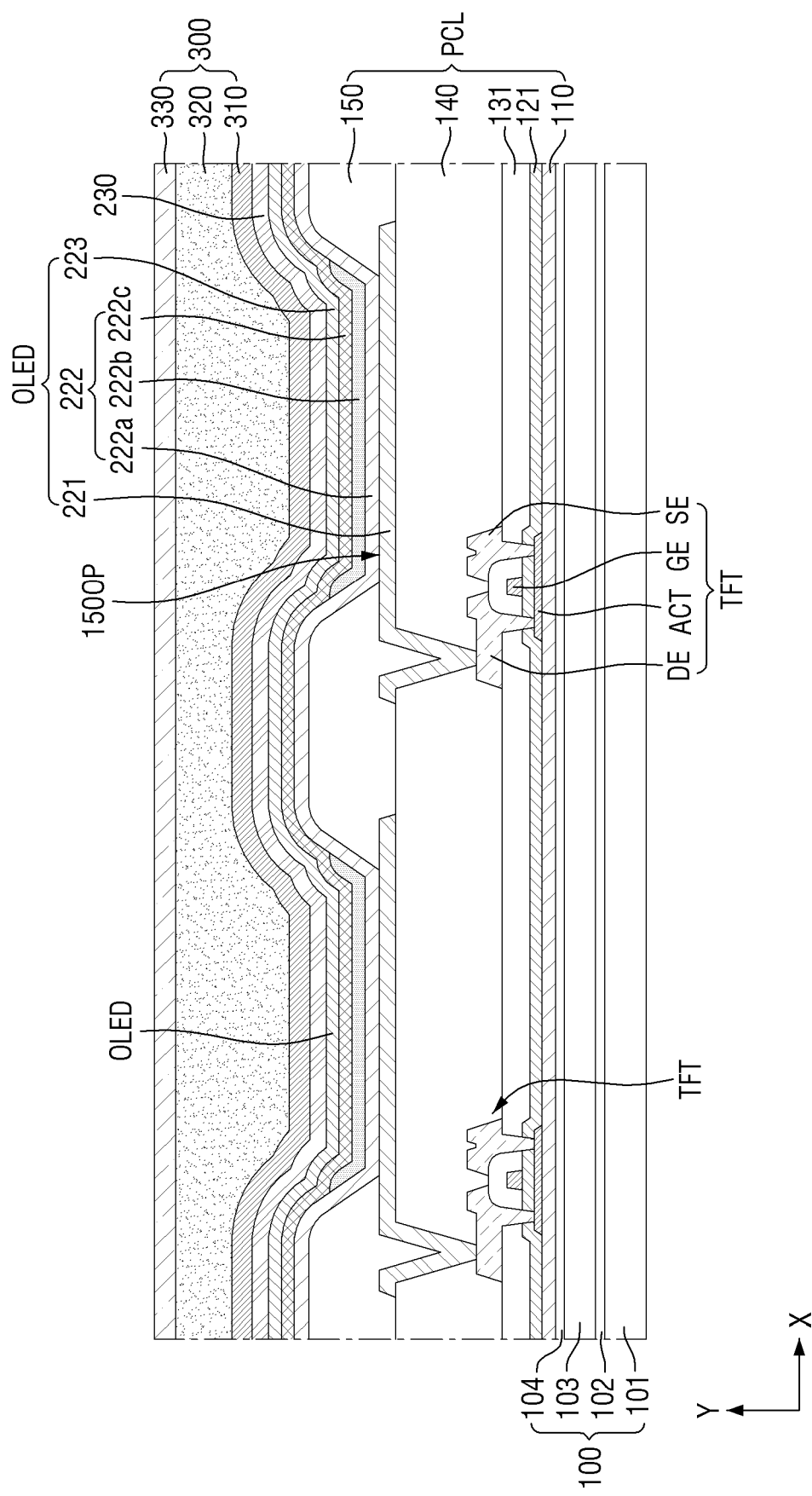
FIG. 3 is a cross-sectional view showing a part of the display device according to an embodiment.

FIG. 3 is a cross-sectional view showing a part of the display device according to an embodiment.

Referring to FIG. 3, a pixel circuit layer PCL including a pixel circuit is disposed on the substrate 100, the organic light-emitting diode OLED as a display element is disposed on the pixel circuit layer PCL, and is covered with the thin film encapsulation layer 300.

The substrate 100 may contain a polymer resin. The substrate 100 containing the polymer resin may have flexible, rollable, or bendable characteristics.

In an embodiment, the substrate 100 may include a first base layer 101, a first barrier layer 102, a second base layer 103, and a second barrier layer 104 as shown in FIG. 3. Each of the first base layer 101 and the second base layer 103 may contain a polymer resin. For example, the first base layer 101 and the second base layer 103 may contain a polymer resin such as polyethersulfone (PES), polyarylate (PAR), polyetherimide (PEI), polyethylene naphthalate (PEN), polyethyleneterephthalate (PET), polyphenylene sulfide (PPS), polyimide (PI), polycarbonate, cellulose triacetate (TAC), cellulose acetate propionate (CAP), etc. The first barrier layer 102 and the second barrier layer 104 are barrier layers that prevent or substantially prevent penetration of external foreign substances, and may be a single layer or multiple layers containing an inorganic material such as silicon nitride and/or silicon oxide.

In some embodiments, the substrate 100 may be a single layer containing a glass material. For example, the substrate 100 may be a glass substrate containing $SiO_2$ as a main component. However, the present disclosure is not limited thereto.

The pixel circuit layer PCL on the substrate 100 may include a thin film transistor TFT, and may include a storage capacitor connected to the thin film transistor TFT. A structure of the thin film transistor TFT may have the same structure for each pixel (e.g., a plurality of thin film transistors TFT may have the same structure as each other and may be formed or provided for each pixel). A thin film transistor TFT may be connected to a corresponding display element provided in a corresponding pixel.

The thin film transistor TFT may include a semiconductor layer Act (containing amorphous silicon, polycrystalline silicon, and/or an organic semiconductor material), a gate electrode GE, a source electrode SE, and a drain electrode DE. In order to secure insulation of the semiconductor layer Act from the gate electrode GE, a gate insulating layer 121 containing an inorganic material such as silicon oxide, silicon nitride and/or silicon oxynitride may be interposed between the semiconductor layer Act and the gate electrode GE. An interlayer insulating layer 131 containing an inorganic material such as silicon oxide, silicon nitride and/or silicon oxynitride may be disposed on the gate electrode GE. The source electrode SE and the drain electrode DE may be disposed on the interlayer insulating layer 131. The insulating layer containing the inorganic material may be formed by any suitable deposition process such as, for example, chemical vapor deposition (CVD) and/or atomic layer deposition (ALD).

The gate electrode GE, the source electrode SE, and the drain electrode DE may be formed of various suitable conductive materials. The gate electrode GE may contain molybdenum or aluminum, and may have a structure of a single layer or multiple layers. For example, the gate electrode GE may have a structure of a single layer containing molybdenum or a three-layer structure including a molybdenum layer, an aluminum layer, and a molybdenum layer. The source electrode SE and the drain electrode DE may contain titanium or aluminum, and may have a structure of a single layer or multiple layers. In an embodiment, the source electrode SE and the drain electrode DE may have a three-layer structure including a titanium layer, an aluminum layer, and a titanium layer.

A buffer layer 110 containing an inorganic material such as silicon oxide, silicon nitride, and/or silicon oxynitride may be interposed between the thin film transistor TFT and the substrate 100 having the above-described structure. The buffer layer 110 may serve to increase planarization of an upper surface of the substrate 100, or to prevent, substantially prevent, or minimize impurities from the substrate 100, etc. from penetrating into the semiconductor layer Act of the thin film transistor TFT.

A planarization insulating layer 140 may be disposed on the thin film transistor TFT. The planarization insulating layer 140 may be formed of an organic material such as acryl, benzocyclobutene (BCB), and/or hexamethyldisiloxane (HMDSO). In FIG. 3, the planarization insulating layer 140 is illustrated as a single layer, but the planarization insulating layer 140 may be multiple layers.

The organic light-emitting diode OLED may include a pixel electrode 221, an intermediate layer 222, and a counter electrode 223.

The pixel electrode 221 is disposed on the planarization insulating layer 140, but may be disposed one for each pixel. The pixel electrode 221 may be a reflective electrode. As an embodiment, the pixel electrode 221 may include a reflective film containing silver (Ag), magnesium (Mg), aluminum (Al), platinum (Pt), palladium (Pd), gold (Au), nickel (Ni), neodymium (Nd), iridium (Ir), chromium (Cr), or a compound thereof. As another embodiment, the pixel electrode 221 may include a transparent or translucent electrode layer disposed above and/or below the reflective film described above. The above-described transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layer structure having an ITO layer, an Ag layer, and an ITO layer.

A pixel-defining layer 150 is disposed on the pixel electrodes 221. The pixel-defining layer 150 has an opening exposing a central portion of each pixel electrode 221. The pixel-defining layer 150 may increase a distance between an edge of the pixel electrode 221 and the counter electrode 223 to prevent or substantially prevent an arc or the like from occurring at the edge of the pixel electrode 221. The pixel-defining layer 150 may be made of an organic insulating material such as polyimide, polyamide, acrylic resin, benzocyclobutene, hexamethyldisiloxane (HMDSO), and/or phenol resin, and may be formed by any suitable method such as, for example, spin coating.

An emission layer 222b may be disposed on the pixel electrode 221 exposed through the opening of the pixel-defining layer 150. The emission layer 222b may be an organic material containing a fluorescent or phosphorescent material capable of emitting red light, green light, or blue light. The above-described organic material may be a low molecular weight organic material or a high molecular weight organic material.

A first functional layer 222a and a second functional layer 222c may be disposed under and over the emission layer 222b, respectively. The first functional layer 222a may include, for example, a hole transport layer (HTL), or may include the HTL and a hole injection layer (HIL). The second functional layer 222c is a component disposed on the emission layer 222b, and may include an electron transport layer (ETL) and/or an electron injection layer (EIL). The second functional layer 222c is optional. In some embodiments, the second functional layer 222c may not be provided.

The emission layers 222b are disposed to correspond to the openings of the pixel-defining layer 150, respectively. For example, the emission layers 222b may be in corresponding openings of the pixel-defining layer 150. Each of the first functional layer 222a and the second functional layer 222c may be a common layer formed integrally so as to cover the substrate 100 (e.g., cover the substrate 100 as a whole). For example, each of the first functional layer 222a and the second functional layer 222c may cover the entire display area of the substrate 100 similar to the counter electrode 223 described in more detail below. In some embodiments, the emission layer 222b may also be formed integrally so as to cover the substrate 100 as a whole. For example, the emission layer 222b may cover the entire display area of the substrate 100 similar to the first functional layer 222a and the second functional layer 222c.

The counter electrode 223 may include a (semi) transparent layer containing silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 223 may further include a layer such as ITO, IZO, ZnO and/or $In_2O_3$ on the (semi) transparent layer containing the above-described material. In an embodiment, the counter electrode 223 may include silver (Ag), magnesium (Mg), or an alloy of silver (Ag) and magnesium (Mg).

The capping layer 230 may be positioned on the counter electrode 223. For example, the capping layer 230 may include LiF, an inorganic insulating material, or an organic insulating material. The capping layer 230 may serve to cover and protect the counter electrode 223 from above (e.g., from the outside). Examples of the inorganic insulating material may include aluminum oxide, titanium oxide, tantalum oxide, hafnium oxide, zinc oxide, silicon oxide, silicon nitride, silicon oxynitride, or the like. In FIG. 3, it is illustrated that the capping layer 230 is formed of a single film, but the capping layer 230 may be formed of a plurality of films (e.g., a plurality of stacked films).

A refractive index and thickness of the capping layer 230 will be described together while describing a refractive index and thickness of the thin film encapsulation layer 300.

The thin film encapsulation layer 300 may be disposed on the capping layer 230. The thin film encapsulation layer 300 may include a first inorganic encapsulation layer 310 disposed on the capping layer 230, an organic encapsulation layer 320 disposed on the first inorganic encapsulation layer 310, and a second inorganic encapsulation layer 330 disposed on the organic encapsulation layer 320. The first inorganic encapsulation layer 310 may be disposed on (e.g., directly on) the capping layer 230, and may be disposed between the capping layer 230 and the organic encapsulation layer 320, and the organic encapsulation layer 320 may be disposed on (e.g., directly on) the first inorganic encapsulation layer 310, and may be disposed between the first inorganic encapsulation layer 310 and the second inorganic encapsulation layer 330, and the second inorganic encapsulation layer 330 may be disposed on (e.g., directly on) the organic encapsulation layer 320.

The first inorganic encapsulation layer 310 and the second inorganic encapsulation layer 330 may include one or more inorganic insulating materials selected from aluminum oxide, titanium oxide, tantalum oxide, hafnium oxide, zinc oxide, silicon oxide, silicon nitride, and silicon oxynitride. In some embodiments, the first inorganic encapsulation layer 310 and the second inorganic encapsulation layer 330 may include an inorganic insulating layer containing a non-metallic element, for example, silicon oxide, silicon nitride, or silicon oxynitride.

The organic encapsulation layer 320 may relieve internal stress of the first inorganic encapsulation layer 310 and/or the second inorganic encapsulation layer 330. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethylmethacrylate, polyacrylic acid, etc.) or any combination thereof.

The organic encapsulation layer 320 may be formed by applying a monomer (e.g., a monomer having flowability) and then curing a monomer layer using heat or light such as ultraviolet rays. Alternatively, the organic encapsulation layer 320 may be formed by applying the polymer-based material described above.

A thickness t5 of the organic encapsulation layer 320 may be larger (e.g., significantly larger) than thicknesses of each of a first sub-inorganic encapsulation layer 311, a second sub-inorganic encapsulation layer 313, and a third sub-inorganic encapsulation layer 315 of the first inorganic encapsulation layer 310 to be described in more detail below. For example, the thickness t5 of the organic encapsulation layer 320 is about 3 μm or more and about 10 μm, which may have a thickness greater than a range of an optical control thickness capable of controlling a change in visibility occurring on the color coordinates as a user's viewing angle increases.

The first inorganic encapsulation layer 310 according to an embodiment may include a plurality of films. The plurality of films of the first inorganic encapsulation layer 310 may be stacked. It is possible to minimize or reduce the occurrence of the change in visibility according to the user's viewing angle by adjusting the refractive indexes (or refractive indices) and thicknesses of the plurality of stacked films of the first inorganic encapsulation layer 310 and the capping layer 230 under the first inorganic encapsulation layer 310. This will be described in more detail in FIG. 4.

Figure 4:
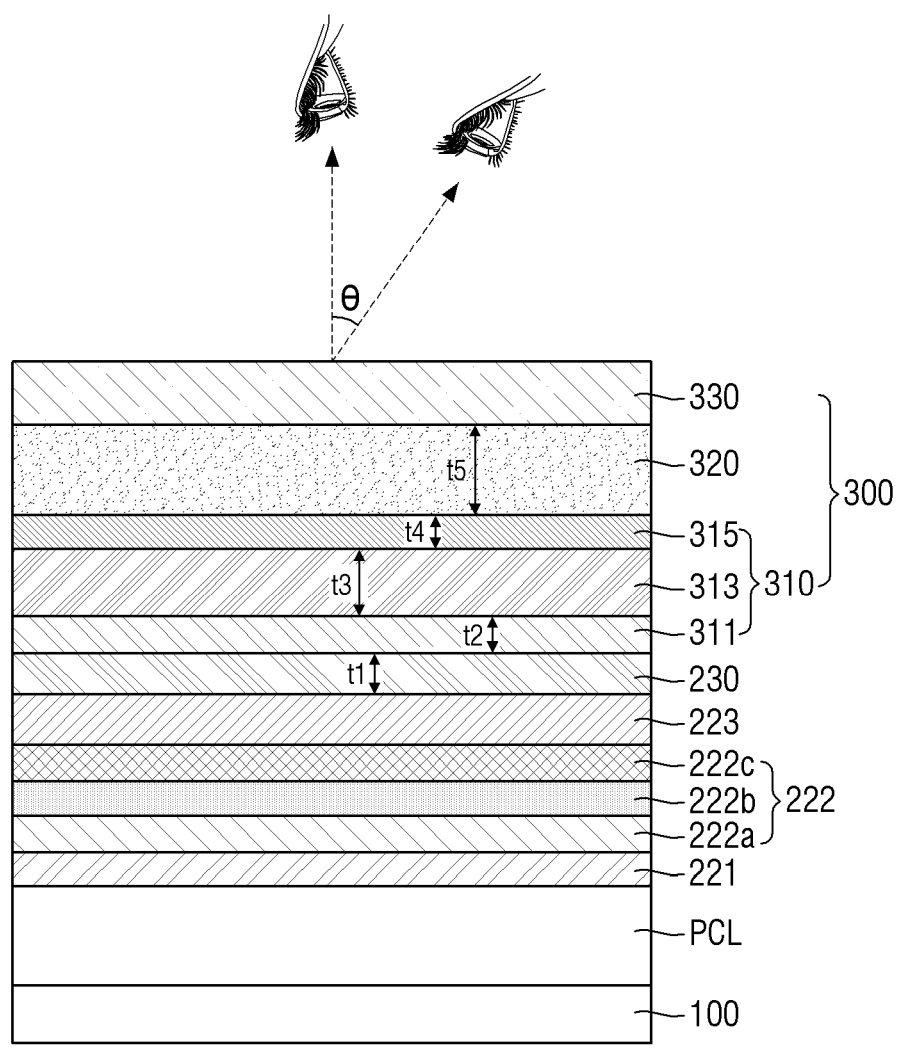
FIG. 4 is a schematic diagram schematically showing the display device according to an embodiment.

FIG. 4 is a schematic diagram schematically showing the display device according to an embodiment.

While describing FIG. 4, a description of the components described in FIG. 3 will be omitted. Referring to FIG. 4, the display device according to the embodiment may reduce a change in visibility according to a user's viewing angle by forming a difference in refractive index between adjacent layers among the plurality of films of the first inorganic encapsulation layer 310 from the capping layer 230. The first inorganic encapsulation layer 310 may include a first sub-inorganic encapsulation layer 311 disposed on (e.g., directly on) the capping layer 230 and disposed between the capping layer 230 and the organic encapsulation layer 320, a second sub-inorganic encapsulation layer 313 disposed on (e.g., directly on) the first sub-inorganic encapsulation layer and disposed between the first sub-inorganic encapsulation layer and the organic encapsulation layer 320, and a third sub-inorganic encapsulation layer 315 disposed between the second sub-inorganic encapsulation layer 313 and the organic encapsulation layer 320 and disposed on (e.g., directly on) the second sub-inorganic encapsulation layer 313. The display device according to the embodiment may reduce the change in visibility according to the user's viewing angle by forming refractive indexes of the capping layer 230 and the second sub-inorganic encapsulation layer 313 to be larger than refractive indexes of the adjacent first and third sub-inorganic encapsulation layers 311 and 315, respectively. In one or more embodiments, the first sub-inorganic encapsulation layer 311 and the third sub-inorganic encapsulation layer 315 have refractive indexes smaller than those of the capping layer 230 and the second sub-inorganic encapsulation layer 313, and the second sub-inorganic encapsulation layer 313 has a refractive index larger than those of the first sub-inorganic encapsulation layer 311 and third sub-inorganic encapsulation layer 315. As used herein, sub-inorganic encapsulation layers such as a "first sub-inorganic encapsulation layer," a "second sub-inorganic encapsulation layer," and a "third sub-inorganic encapsulation layer" are used merely to distinguish an inorganic encapsulation layer from another inorganic encapsulation layer for ease of description, and therefore, a sub-inorganic encapsulation layer and an inorganic encapsulation layer may be used interchangeably throughout the present disclosure.

Meanwhile, when a difference in refractive index between adjacent layers or films is finely formed and a thickness of each of layers or films is formed intentionally, it is possible to prevent or reduce a change in visibility to a specific color according to a user's viewing angle θ. Here, as shown in FIG. 4, the viewing angle θ may be defined as an angle between a user's gaze direction and a normal vector of an upper surface of the second inorganic encapsulation layer 330. When viewing the display device in a vertical direction (e.g., in a plan view), the viewing angle θ becomes 0°.

According to an embodiment, as described in more detail below, it is possible to prevent or reduce a change in visibility to blue as the user's viewing angle increases by finely adjusting a difference in refractive index between adjacent layers or films of the capping layer 230, the first sub-inorganic encapsulation layer 311, the second sub-inorganic encapsulation layer 313, and the third sub-inorganic encapsulation layer 315. Further, thicknesses t1, t2, t3, and t4 of each of layers or films are factors that have an important influence (e.g., factors for forming resonance) on a change in optical visibility, and thus the thickness of each of the layers should also be adjusted (e.g., finely adjusted).

The refractive indexes of the first sub-inorganic encapsulation layer 311, the second sub-inorganic encapsulation layer 313, and the third sub-inorganic encapsulation layer 315 may be changed depending on a material of each of the first sub-inorganic encapsulation layer 311, the second sub-inorganic encapsulation layer 313, and the third sub-inorganic encapsulation layer 315 and a composition ratio of the corresponding material. The material and composition ratio of each of the first sub-inorganic encapsulation layer 311, the second sub-inorganic encapsulation layer 313, and the third sub-inorganic encapsulation layer 315 will be described in more detail below.

In order to prevent or substantially prevent an occurrence of a change in visibility to blue (e.g., bluish color is generated or perceived) as the user's viewing angle increases, in terms of refractive index, the refractive index of the capping layer 230 may be set to 1.3 times to 1.9 times the refractive index of the first sub-inorganic encapsulation layer 311, and the refractive index of the second sub-inorganic encapsulation layer 313 may be set to 1.01 times to 1.47 times the refractive index of the first sub-inorganic encapsulation layer 311, and the refractive index of the second sub-inorganic encapsulation layer 313 may be set to 1.01 times to 1.47 times the refractive index of the third sub-inorganic encapsulation layer 315, and in terms of thickness, the thickness t3 of the second sub-inorganic encapsulation layer 313 may be set to 3 times to 30 times the thickness t2 of the first sub-inorganic encapsulation layer 311, the thickness t4 of the third sub-inorganic encapsulation layer 315, and/or the thickness t1 of the capping layer 230.

When the refractive index of the capping layer 230 is 1.3 times or more the refractive index of the first sub-inorganic encapsulation layer 311, the refractive index of the second sub-inorganic encapsulation layer 313 is 1.01 times or more the refractive index of the first sub-inorganic encapsulation layer 311, and the refractive index of the second sub-inorganic encapsulation layer 313 is 1.01 times or more the refractive index of the third sub-inorganic encapsulation layer 315, a constant difference in refractive index occurs between adjacent layers, and thus it is possible to effectively reduce a change amount in visibility on the color coordinates as the user's viewing angle increases, and further, when the refractive index of the capping layer 230 is 1.9 times or less that of the first sub-inorganic encapsulation layer 311, the refractive index of the second sub-inorganic encapsulation layer 313 is 1.47 times or less that of the first sub-inorganic encapsulation layer 311, and the refractive index of the second sub-inorganic encapsulation layer 313 is 1.47 times or less that of the third sub-inorganic encapsulation layer 315, it is possible to effectively reduce occurring of a change in visibility to "blue".

Furthermore, when the thickness t3 of the second sub-inorganic encapsulation layer 313 is 3 times or more the thickness t2 of the first sub-inorganic encapsulation layer 311, the thickness t4 of the third sub-inorganic encapsulation layer 315, and/or the thickness t1 of the capping layer 230, it is possible to effectively reduce a change amount in visibility to "blue" on the color coordinates as the user's viewing angle increases, and when the thickness t3 of the second sub-inorganic encapsulation layer 313 is 30 times or less the thickness t2 of the first sub-inorganic encapsulation layer 311, the thickness t4 of the third sub-inorganic encapsulation layer 315, and/or the thickness t1 of the capping layer 230, the second sub-inorganic encapsulation layer 313 may satisfy an optical control thickness capable of controlling the change in visibility occurring on the color coordinates as the user's viewing angle increases.

An example refractive index of the capping layer 230 satisfying refractive index ranges of the capping layer 230, the first sub-inorganic encapsulation layer 311, the second sub-inorganic encapsulation layer 313, and the third sub-inorganic encapsulation layer 315 described above may be 1.7 to 2.4, and the refractive index of the first sub-inorganic encapsulation layer 311 may be 1.3 to 1.62, the refractive index of the second sub-inorganic encapsulation layer 313 may be 1.64 to 1.9, and the refractive index of the third sub-inorganic encapsulation layer 315 may be 1.3 to 1.62.

Further, example thicknesses of the first sub-inorganic encapsulation layer 311 and the third sub-inorganic encapsulation layer 315 may each be 500 nm to 1,500 nm, thereby satisfying thickness ranges of the capping layer 230, the first sub-inorganic encapsulation layer 311, the second sub-inorganic encapsulation layer 313, and the third sub-inorganic encapsulation layer 315 described above, the thickness of the second sub-inorganic encapsulation layer 313 may be 5,000 nm to 15,000 nm, and the thickness t1 of the capping layer 230 may be 500 nm to 1,500 nm.

The refractive indexes of the first sub-inorganic encapsulation layer 311, the second sub-inorganic encapsulation layer 313, and the third sub-inorganic encapsulation layer 315 may be changed depending on the material of each of the first sub-inorganic encapsulation layer 311, the second sub-inorganic encapsulation layer 313, and the third sub-inorganic encapsulation layer 315 and the composition ratio of the corresponding material. Each of the first sub-inorganic encapsulation layer 311, the second sub-inorganic encapsulation layer 313, and the third sub-inorganic encapsulation layer 315 according to the embodiment may include silicon oxynitride. The first sub-inorganic encapsulation layer 311, the second sub-inorganic encapsulation layer 313, and the third sub-inorganic encapsulation layer 315 are not limited thereto, but may be formed by any suitable method such as, for example, chemical vapor deposition (CVD) method. More specifically, the first sub-inorganic encapsulation layer 311, the second sub-inorganic encapsulation layer 313, and the third sub-inorganic encapsulation layer 315 may be formed, for example, by supplying silane ($SiH_4$), ammonium ($NH_4$), and oxygen ($O_2$), and supply ratios of silane ($SiH_4$), ammonium ($NH_4$), and oxygen ($O_2$) may be adjusted to change the composition ratios of materials of the first sub-inorganic encapsulation layer 311, the second sub-inorganic encapsulation layer 313, and the third sub-inorganic encapsulation layer 315, and accordingly, the refractive indexes of the first sub-inorganic encapsulation layer 311, the second sub-inorganic encapsulation layer 313, and the third sub-inorganic encapsulation layer 315 may be changed by the changed composition ratios.

Normally, a refractive index of silicon oxynitride formed by a chemical vapor deposition method through the supply of silane ($SiH_4$), ammonium ($NH_4$), and oxygen ($O_2$) may be increased as the supply ratio of ammonium ($NH_4$) increases and the supply ratio of oxygen ($O_2$) decreases. In other words, the refractive index of silicon oxynitride may be increased as a content of nitrogen (N) in the silicon oxynitride material of each of the first sub-inorganic encapsulation layer 311, the second sub-inorganic encapsulation layer 313, and the third sub-inorganic encapsulation layer 315 increases and a content of oxygen (O) decreases.

Therefore, in order to have a gradient of high/low/high/low refractive index from the capping layer 230 to the first sub-inorganic encapsulation layer 311, the second sub-inorganic encapsulation layer 313, and the third sub-inorganic encapsulation layer 315 in a stacking order, a nitrogen content in the second sub-inorganic encapsulation layer 313 should be larger than nitrogen contents in the first sub-inorganic encapsulation layer 311 and the third sub-inorganic encapsulation layer 315, and an oxygen content should be smaller.

Further, according to an embodiment, in order to set the refractive index of the capping layer 230 to 1.3 times to 1.9 times the refractive index of the first sub-inorganic encapsulation layer 311, the refractive index of the second sub-inorganic encapsulation layer 313 to 1.01 times to 1.47 times the refractive index of the first sub-inorganic encapsulation layer 311, the refractive index of the second sub-inorganic encapsulation layer 313 to 1.01 times to 1.47 times the refractive index of the third sub-inorganic encapsulation layer 315, the nitrogen and oxygen contents of each of the first sub-inorganic encapsulation layer 311, the second sub-inorganic encapsulation layer 313, and the third sub-inorganic encapsulation layer 315 should also be adjusted (e.g., finely adjusted).

The nitrogen (N) content relative to the silicon (Si) content of the first sub-inorganic encapsulation layer 311 satisfying the above-described range may be 0.25 to 0.45, the oxygen (O) content relative to the silicon (Si) content of the first sub-inorganic encapsulation layer 311 may be 0.75 to 0.80, the nitrogen content relative to the silicon content of the second sub-inorganic encapsulation layer 313 may be 0.55 to 0.70, the oxygen content relative to the silicon content of the second sub-inorganic encapsulation layer 313 may be 0.25 to 0.35, the nitrogen content relative to the silicon content of the third sub-inorganic encapsulation layer 315 may be 0.45 to 0.55, and the oxygen content relative to the silicon content of the third sub-inorganic encapsulation layer 315 may be 0.55 to 0.70.

Hereinafter, it will be described that a change in visibility according to a viewing angle is reduced on the color coordinates shown through a stacked structure of the capping layer 230, the first sub-inorganic encapsulation layer 311, the second sub-inorganic encapsulation layer 313, and the third sub-inorganic encapsulation layer 315 according to an embodiment.

Figure 5:
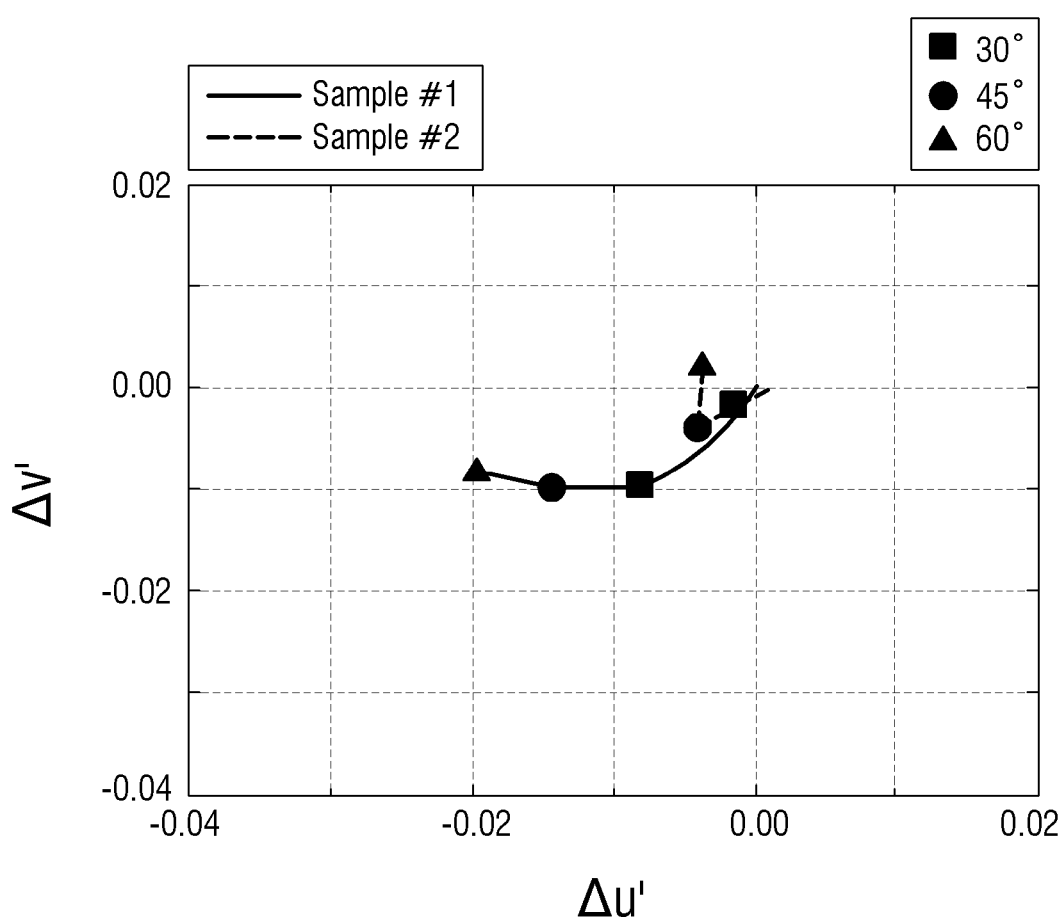
FIG. 5 is a graph showing a change amount of a first component ($\Delta u'$) and a change amount of a second component ($\Delta v'$) according to a viewing angle on color coordinates.
Figure 6:
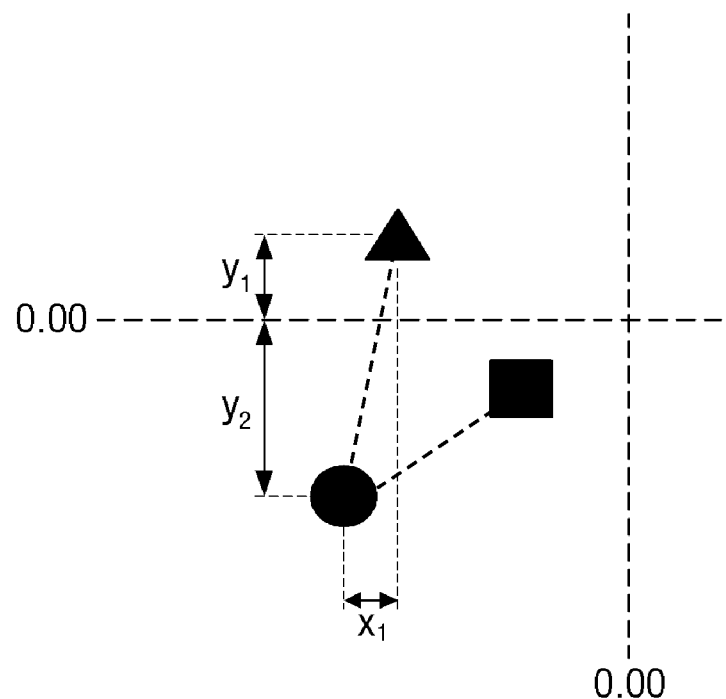
FIG. 6 is an enlarged view of a part of FIG. 5.

FIG. 5 is a graph showing a change amount of a first component ($\Delta u'$) and a change amount of a second component ($\Delta v'$) according to a viewing angle on color coordinates. FIG. 6 is an enlarged view of a part of FIG. 5.

Referring to FIGS. 5 and 6, the graph of FIG. 5 is a color coordinate (CIE diagram) of the visible light region, a horizontal axis represents the change amount of the first component ($\Delta u'$), and a vertical axis represents the change amount of the second component ($\Delta v'$). In case of normal color coordinates, the horizontal and vertical axes represent a value of the first component u' and a value of the second component v', respectively, and have values of 0 and rational numbers greater than 0, respectively. On the other hand, the color coordinates shown in FIG. 5 represent the change amount of each component, and have 0, a rational number smaller than 0, and a rational number larger than 0, respectively. On the color coordinates, it may be seen that the smaller the value of the first component u' and the value of the second component v' together, the greater a proportion of the blue component in the visible light, it may be seen that a proportion of the green component in the visible light becomes larger when the value of the first component u' becomes smaller and the value of the second component v' becomes larger, and it may be seen that a proportion of the red component in the visible light becomes larger when the value of the first component u' becomes larger and the value of the second component v' becomes smaller.

In FIG. 5, a second sample (Sample #2) having a difference in refractive index between the above-described adjacent layers of the capping layer 230 and the first inorganic encapsulation layer 310 including the plurality of films in FIG. 4, a refractive index range of each layer, and a thickness range of each layer, and a first sample (Sample #1) which does not have a difference in refractive index between the above-described adjacent layers of the capping layer and the first inorganic encapsulation layer including the plurality of films, a refractive index range of each layer, and a thickness range of each layer are illustrated.

On the color coordinates of each sample (Sample #1, Sample #2), colors (representing the change amount of color components as described above) that are visible to a user at viewing angles of 30°, 45°, and 60° are displayed as a shape of figures (a viewing angle 30° is a square, a viewing angle 45° is a circle, a viewing angle 60° is a triangle), and figures representing colors corresponding to the viewing angles are connected in ascending order of the viewing angle. Each sample (Sample #1, Sample #2) was measured in a state of full light emission of the display device, and a starting point (viewing angle 0°) of each sample (Sample #1, Sample #2), that is, a point at which a change amount of the first component ($\Delta u'$) and a change amount of the second component ($\Delta v'$) are 0, respectively, represents a white color (normally, although not shown in the graph of FIG. 5, light to be visible by the user may be recognized as white in a white zone).

In a case of the first sample (Sample #1), the change amount of the first component ($\Delta u'$) and the change amount of the second component ($\Delta v'$) at the viewing angle of 30° are about −0.008 and about −0.01, respectively, the change amount of the first component ($\Delta u'$) and the change amount of the second component ($\Delta v'$) at the viewing angle of 45° are about −0.015 and about −0.01, respectively, and the change amount of the first component ($\Delta u'$) and the change amount of the second component ($\Delta v'$) at the viewing angle of 60° represents about −0.02 and −0.018, respectively. That is, in the case of the first sample (Sample #1), it can be seen that as the viewing angle increases, the change amount of the first component ($\Delta u'$) and the change amount of the second component ($\Delta v'$) gradually decrease, and thus the degree occupied by the blue component of the visible light increases.

On the other hand, in a case of the second sample (Sample #2), it shows a tendency different from the first sample (Sample #1). First, in the case of the second sample (Sample #2), as the viewing angle goes from 30° to 45°, the change amount of the first component ($\Delta u'$) and the change amount of the second component ($\Delta v'$) become smaller, but unlike the first sample (Sample #1), when going from the viewing angle of 45° to the viewing angle of 60°, it can be seen that the change amount of the first component ($\Delta u'$) and the change amount of the second component ($\Delta v'$) become larger. That is, the change amount of the first component ($\Delta u'$) at the viewing angle of 60° is smaller than the change amount of the first component ($\Delta u'$) at the viewing angle of 45°, that is, the magnitude (or absolute value) of the change amount of the second component ($\Delta v'$) at the viewing angle of 60° may be smaller than an absolute value of the change amount of the second component ($\Delta v'$) at the viewing angle of 45°. That is, a value obtained by subtracting the change amount of the first component ($\Delta u'$) at the viewing angle of 45° from the change amount of the first component ($\Delta u'$) at the viewing angle of 60° may be a positive value.

The change amount of the second component ($\Delta v'$) at the viewing angle of 60° is greater than the change amount of the second component ($\Delta v'$) at the viewing angle of 45°. Further, while going from the viewing angle of 45° to the viewing angle of 60°, the change amount of the second component ($\Delta v'$) rather changes from a negative value to a positive value. In addition, the magnitude ($y_1$, or absolute value) of the change amount of the second component ($\Delta v'$) changed to the positive value at the viewing angle of 60° may be smaller than the magnitude ($y_2$, or absolute value) of the change amount of the second component ($\Delta v'$) at the viewing angle of 45°.

Specifically, the change amount of the first component ($\Delta u'$) and the change amount of the second component ($\Delta v'$) at the viewing angle of 30° are about −0.002 and about −0.002, respectively, the change amount of the first component ($\Delta u'$) and the change amount of the second component ($\Delta v'$) at the viewing angle of 45° are about −0.004 and about −0.004, respectively, the change amount of the second component ($\Delta v'$) at the viewing angle of 60° may have a positive value, and the change amount of the first component ($\Delta u'$) may have a negative value. The change amount of the first component ($\Delta u'$) and the change amount of the second component ($\Delta v'$) at the viewing angle of 60° represent about −0.003 and about −0.002, respectively. In one or more embodiments, as shown in FIG. 6, the difference (xi) in change amount between the first component ($\Delta u'$) at the viewing angle of 45° and the first component ($\Delta u'$) at the viewing angle of 60° may be about 0.001.

In the case of the second sample (Sample #2), the change amount of the first component ($\Delta u'$) and the change amount of the second component ($\Delta v'$) at each of the viewing angles are generally located in the white zone, so that even when the user views the display device with a viewing angle of 0° or more, it is possible to prevent or reduce a change in visibility to blue (e.g., bluish color is generated or perceived).

Hereinafter, another embodiment of a display device will be described.

Figure 7:
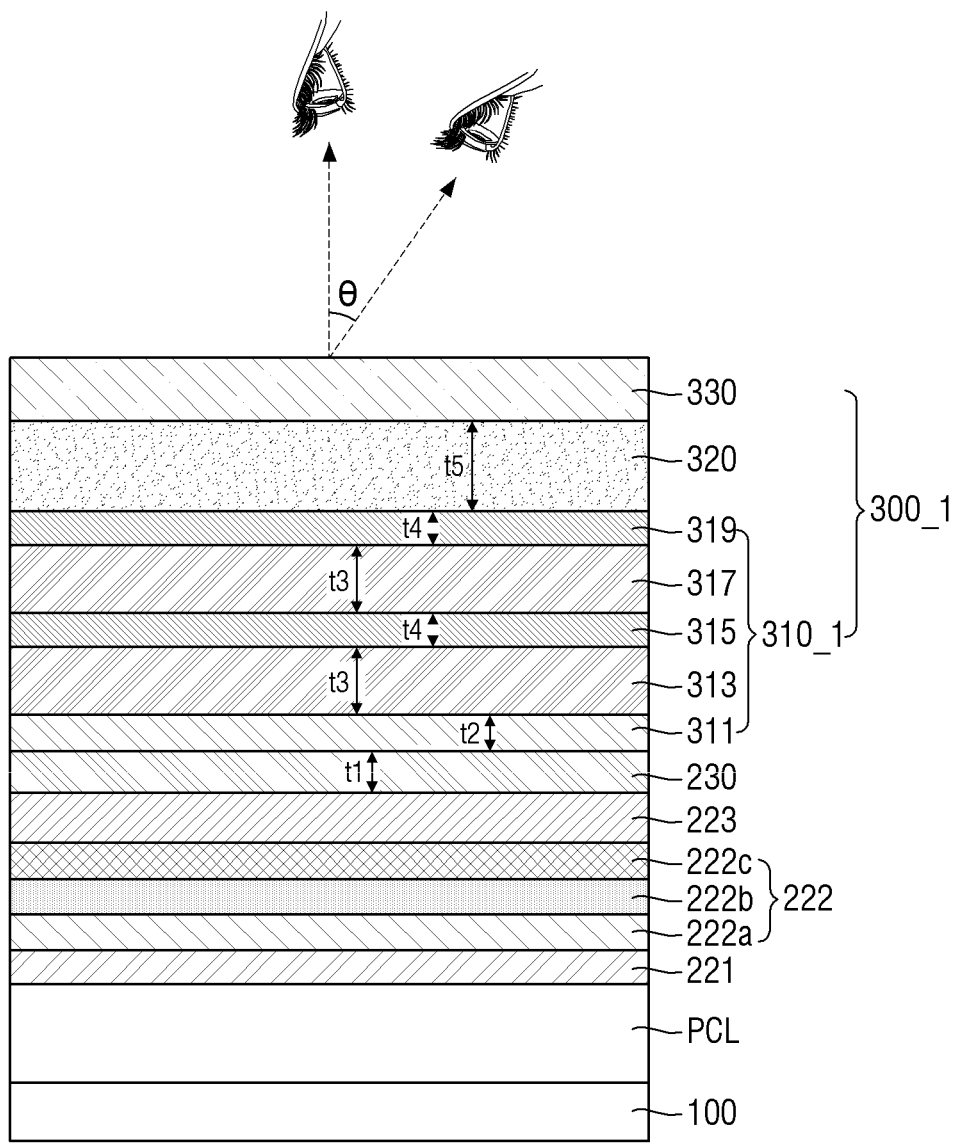
FIG. 7 is a schematic diagram schematically showing a display device according to another embodiment.

FIG. 7 is a schematic diagram schematically showing a display device according to another embodiment.

Referring to FIG. 7, in the display device according to the illustrated embodiment, a thin film encapsulation layer 300_1 is different from the thin film encapsulation layer 300 according to FIG. 4 in that it includes a first inorganic encapsulation layer 310_1.

More specifically, the first inorganic encapsulation layer 310_1 illustrates that a second sub-inorganic encapsulation layer and a third sub-inorganic encapsulation layer may be disposed alternately in a thickness direction. As shown in FIG. 7, a second sub-inorganic encapsulation layer 317 may be disposed on a third sub-inorganic encapsulation layer 315, and a third sub-inorganic encapsulation layer 319 may be disposed on the second sub-inorganic encapsulation layer 317. The second sub-inorganic encapsulation layer 317 and the third sub-inorganic encapsulation layer 319 have different reference numerals from the second sub-inorganic encapsulation layer 313 and the third sub-inorganic encapsulation layer 315 respectively, but the second sub-inorganic encapsulation layer 317 may have the same configuration as the second sub-inorganic encapsulation layer 313 described above and the third sub-inorganic encapsulation layer 319 may have the same configuration as the third sub-inorganic encapsulation layer 315 described above. In one or more embodiments, the second sub-inorganic encapsulation layer 317 may be on (e.g., directly on) the third sub-inorganic encapsulation layer 315 as shown in FIG. 7.

In FIG. 7, it is illustrated that the first inorganic encapsulation layer 310_1 includes two second sub-inorganic encapsulation layers 313 and 317 and two third sub-inorganic encapsulation layers 315 and 319, but the present disclosure is not limited thereto, and in one or more embodiments, the first inorganic encapsulation layer 310_1 may include three or more second sub-inorganic encapsulation layers and/or three or more third sub-inorganic encapsulation layers.

As in the illustrated embodiment, when the second sub-inorganic encapsulation layer and the third sub-inorganic encapsulation layer are alternately disposed (e.g., alternately arranged with each other) in the thickness direction, as the user's viewing angle increases, an effect of preventing or reducing a change in visibility to blue (e.g., bluish color is generated or perceived) becomes even better (i.e., is improved). However, because a thickness of the thin film encapsulation layer 300_1 increases as the number of each of the second sub-inorganic encapsulation layer and the third sub-inorganic encapsulation layer increases, it may be desirable that the number of each of the second and third sub-inorganic encapsulation layers is three or less.

Figure 8:
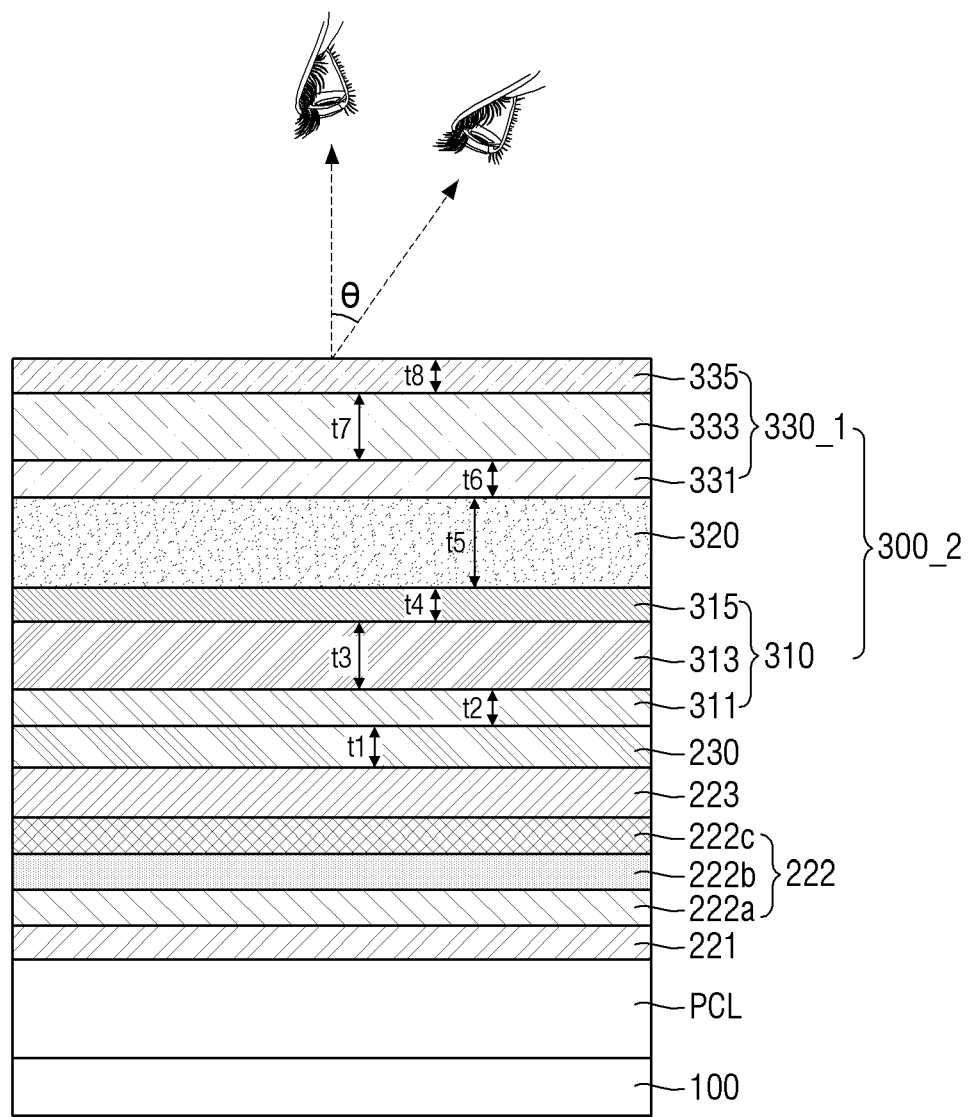
FIG. 8 is a schematic diagram schematically showing a display device according to still another embodiment.

FIG. 8 is a schematic diagram schematically showing a display device according to still another embodiment.

Referring to FIG. 8, in the display device according to the illustrated embodiment, a thin film encapsulation layer 300_2 is different from the thin film encapsulation layer 300 according to FIG. 4 in that a second inorganic encapsulation layer 330_1 of the thin film encapsulation layer 300_2 includes a plurality of films (e.g., a fourth inorganic encapsulation layer 331, an upper inorganic encapsulation layer 333, and a fifth inorganic encapsulation layer 335).

More specifically, the second inorganic encapsulation layer 330_1 may include a fourth inorganic encapsulation layer 331 disposed on an organic encapsulation layer 320, an upper inorganic encapsulation layer 333 spaced from the organic encapsulation layer 320 with the fourth inorganic encapsulation layer 331 interposed therebetween, and a fifth inorganic encapsulation layer 335 spaced from the fourth inorganic encapsulation layer 331 with the upper inorganic encapsulation layer 333 interposed therebetween.

The second inorganic encapsulation layer 330_1 according to the illustrated embodiment may reduce a change in visibility according to a user's viewing angle by forming a difference in refractive index between adjacent films among the plurality of films (e.g., the fourth inorganic encapsulation layer 331, the upper inorganic encapsulation layer 333, and the fifth inorganic encapsulation layer 335) of the second inorganic encapsulation layer 330_1 from the organic encapsulation layer 320, like (e.g., the same or substantially the same as) the first inorganic encapsulation layer 310 described above in FIG. 4.

A refractive index of the organic encapsulation layer 320 may be larger than the refractive index of the fourth inorganic encapsulation layer 331, and a refractive index of the upper inorganic encapsulation layer 333 may be larger than the refractive index of each of the fourth inorganic encapsulation layer 331 and the fifth inorganic encapsulation layer 335.

In order to prevent or reduce a change in visibility to blue (e.g., bluish color is generated or perceived) from occurring as the user's viewing angle increases, in terms of refractive index, the refractive index of the organic encapsulation layer 320 may be set to 1.3 times to 1.9 times the refractive index of the fourth inorganic encapsulation layer 331, the refractive index of the upper inorganic encapsulation layer 333 may be set to 1.01 times to 1.47 times the refractive index of the fourth inorganic encapsulation layer 331, and the refractive index of the second sub-inorganic encapsulation layer 313 may be set to 1.01 times to 1.47 times the refractive index of the fifth inorganic encapsulation layer 335, and in terms of thickness, a thickness t7 of the upper inorganic encapsulation layer 333 may be set to 3 times to 30 times a thickness t6 of the fourth inorganic encapsulation layer 331 and/or a thickness t8 of the fifth inorganic encapsulation layer 335.

However, as described above, because a thickness of the organic encapsulation layer 320 is larger than a range of optical control thickness, as compared with the first inorganic encapsulation layer 310, the influence on reducing the change in visibility according to the user's viewing angle may be reduced.

Figure 9:
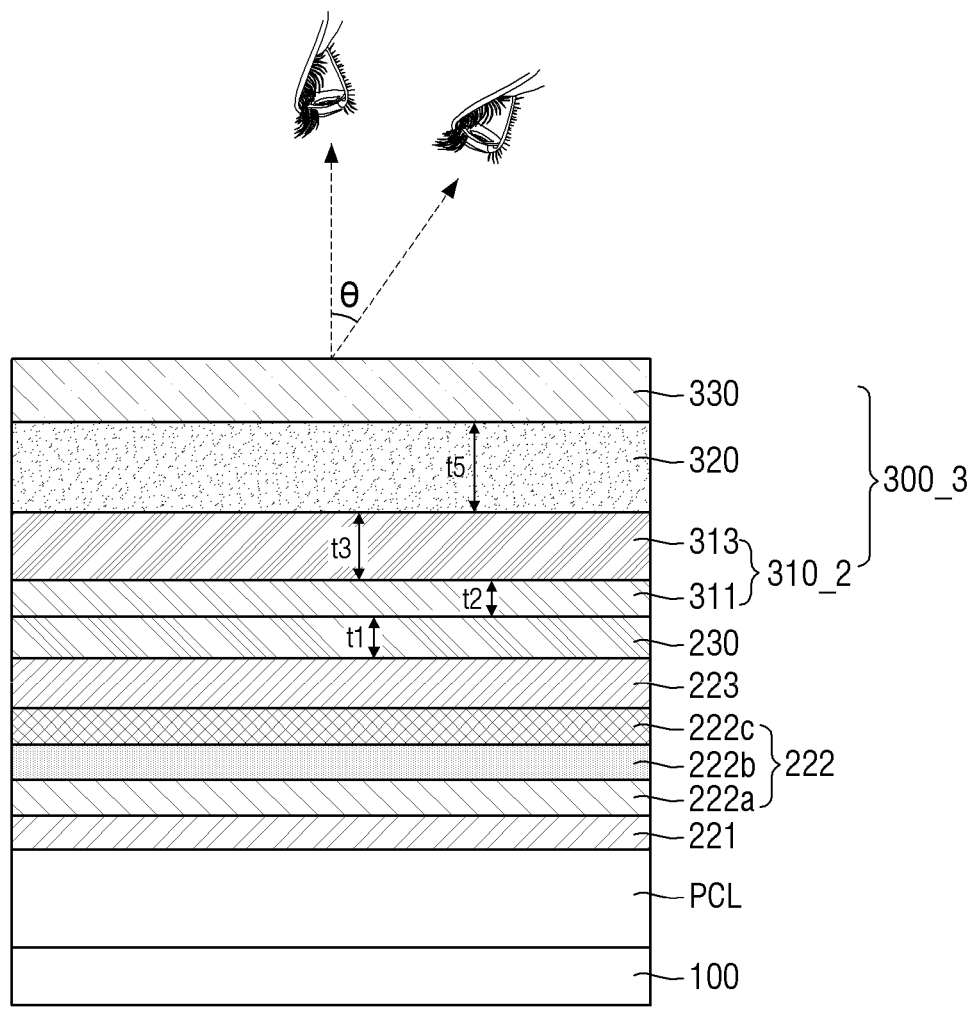
FIG. 9 is a schematic diagram schematically showing a display device according to yet another embodiment.

FIG. 9 is a schematic diagram schematically showing a display device according to yet another embodiment.

Referring to FIG. 9, in the display device according to the illustrated embodiment, a thin film encapsulation layer 300_3 is different from the thin film encapsulation layer 300 according to FIG. 4 in that the third sub-inorganic encapsulation layer 315 of FIG. 4 is omitted, and the organic encapsulation layer 320 is disposed on (e.g., directly on) the second sub-inorganic encapsulation layer 313.

More specifically, the third sub-inorganic encapsulation layer 315 forms a difference in refractive index in the relation to the lower second sub-inorganic encapsulation layer 313 thereunder to serve a function in reducing the change in visibility to blue according to the user's viewing angle, and it is possible to reduce a dispersion of respective coordinates appearing on the color coordinates to be visible to the user at the viewing angles of 30°, 45°, and 60°, respectively. As shown in FIG. 9, when the third sub-inorganic encapsulation layer 315 is omitted, there is a limit to reducing the dispersion of the respective coordinates appearing on the color coordinates to be visible to the user at the viewing angles of 30°, 45°, and 60°, but there is an advantage that it is possible to reduce the overall thickness of the thin film encapsulation layer 300_3, and to reduce a manufacturing process time of the display device. Therefore, as shown in FIG. 9, the thin film encapsulation layer 300_3 includes a first inorganic encapsulation layer 310_2 including the first sub-inorganic encapsulation layer 311 and the second sub-inorganic encapsulation layer 313 arranged in a thickness direction without the third sub-inorganic encapsulation layer 315 arranged in the thin film encapsulation layer 300 according to FIG. 4.

The display device according to embodiments of the present disclosure may reduce a change in visibility according to a user's viewing angle due to a structure of a thin film encapsulation layer.

Effects according to the embodiments are not limited by the contents illustrated above, and more various effects are included in the present specification.

As described above, the present disclosure has been described with reference to embodiments thereof, for example, as shown in the drawings, but these are only examples, and those of ordinary skill in the art will understand that various modifications and variations of the embodiment are possible therefrom without departing from the spirit and scope of the present disclosure. Therefore, the true technical protection scope of the present disclosure should be determined by the technical spirit of the appended claims, and equivalents thereof.

What is claimed is:

1. A display device comprising:
a substrate;
a light-emitting element on the substrate;
a capping layer on the light-emitting element;
a first inorganic encapsulation layer on the capping layer;
an organic encapsulation layer on the first inorganic encapsulation layer; and
a second inorganic encapsulation layer on the organic encapsulation layer,
wherein the first inorganic encapsulation layer comprises:
a first sub-inorganic encapsulation layer between the capping layer and the organic encapsulation layer; and
a second sub-inorganic encapsulation layer between the first sub-inorganic encapsulation layer and the organic encapsulation layer, wherein a thickness of the second sub-inorganic encapsulation layer is 3 times to 30 times a thickness of the first sub-inorganic encapsulation layer and/or a thickness of the capping layer, wherein a refractive index of the capping layer is larger than a refractive index of the first sub-inorganic encapsulation layer, wherein a refractive index of the second sub-inorganic encapsulation layer is larger than the refractive index of the first sub-inorganic encapsulation layer, wherein the refractive index of the capping layer is 1.3 times to 1.9 times the refractive index of the first sub-inorganic encapsulation layer, and wherein the refractive index of the second sub-inorganic encapsulation layer is 1.01 times to 1.47 times the refractive index of the first sub-inorganic encapsulation layer.

2. The display device of claim 1, wherein the first sub-inorganic encapsulation layer is directly on the capping layer, and
wherein the second sub-inorganic encapsulation layer is directly on the first sub-inorganic encapsulation layer.

3. The display device of claim 2, wherein the refractive index of the capping layer is 1.7 to 2.4.

4. The display device of claim 3, wherein the refractive index of the first sub-inorganic encapsulation layer is 1.3 to 1.62.

5. The display device of claim 4, wherein the refractive index of the second sub-inorganic encapsulation layer is 1.64 to 1.9.

6. The display device of claim 5, wherein the thickness of the capping layer is 500 nm to 1,500 nm.

7. The display device of claim 6, wherein the thickness of the first sub-inorganic encapsulation layer is 500 nm to 1,500 nm.

8. The display device of claim 7, wherein the thickness of the second sub-inorganic encapsulation layer is 5,000 nm to 15,000 nm.

9. The display device of claim 8, wherein the first inorganic encapsulation layer further comprises a third sub-inorganic encapsulation layer between the second sub-inorganic encapsulation layer and the organic encapsulation layer, and
wherein the refractive index of the second sub-inorganic encapsulation layer is larger than a refractive index of the third sub-inorganic encapsulation layer.

10. The display device of claim 9, wherein the third sub-inorganic encapsulation layer is directly on the second sub-inorganic encapsulation layer.

11. The display device of claim 10, wherein the refractive index of the second sub-inorganic encapsulation layer is 1.01 times to 1.47 times the refractive index of the third sub-inorganic encapsulation layer.

12. The display device of claim 11, wherein the refractive index of the third sub-inorganic encapsulation layer is 1.3 to 1.62, and
wherein a thickness of the third sub-inorganic encapsulation layer is 500 nm to 1,500 nm.

13. The display device of claim 9, wherein the second inorganic encapsulation layer comprises a fourth inorganic encapsulation layer on the organic encapsulation layer, an upper inorganic encapsulation layer spaced from the organic encapsulation layer with the fourth inorganic encapsulation layer interposed therebetween, and a fifth inorganic encapsulation layer spaced from the fourth inorganic encapsulation layer with the upper inorganic encapsulation layer interposed therebetween, wherein a refractive index of the organic encapsulation layer is larger than a refractive index of the fourth inorganic encapsulation layer, and wherein a refractive index of the upper inorganic encapsulation layer is larger than each of the refractive index of the fourth inorganic encapsulation layer and a refractive index of the fifth inorganic encapsulation layer.

14. The display device of claim 8, wherein the first sub-inorganic encapsulation layer and the second sub-inorganic encapsulation layer of the first inorganic encapsulation layer are alternately arranged with each other.

15. A display device comprising:
a substrate;
a light-emitting element on the substrate;
a capping layer on the light-emitting element;
a first inorganic encapsulation layer on the capping layer;
an organic encapsulation layer on the first inorganic encapsulation layer; and
a second inorganic encapsulation layer on the organic encapsulation layer,
wherein the first inorganic encapsulation layer comprises:
a first sub-inorganic encapsulation layer between the capping layer and the organic encapsulation layer;
a second sub-inorganic encapsulation layer between the first sub-inorganic encapsulation layer and the organic encapsulation layer; and
a third sub-inorganic encapsulation layer between the second sub-inorganic encapsulation layer and the organic encapsulation layer,
wherein a refractive index of the capping layer is larger than a refractive index of the first sub-inorganic encapsulation layer,
wherein a refractive index of the second sub-inorganic encapsulation layer is larger than each of the refractive index of the first sub-inorganic encapsulation layer and a refractive index of the third sub-inorganic encapsulation layer,
wherein the first sub-inorganic encapsulation layer, the second sub-inorganic encapsulation layer, and the third sub-inorganic encapsulation layer contain silicon, nitrogen, and oxygen, respectively,
wherein an atomic content of nitrogen relative to an atomic content of silicon in the first sub-inorganic encapsulation layer is 0.25 to 0.45, wherein an atomic content of oxygen relative to the atomic content of silicon in the first sub-inorganic encapsulation layer is 0.75 to 0.80,
wherein an atomic content of nitrogen relative to an atomic content of silicon in the second sub-inorganic encapsulation layer is 0.55 to 0.70, wherein an atomic content of oxygen relative to the atomic content of silicon in the second sub-inorganic encapsulation layer is 0.25 to 0.35,
wherein an atomic content of nitrogen relative to an atomic content of silicon in the third sub-inorganic encapsulation layer is 0.45 to 0.55, wherein an atomic content of oxygen relative to the atomic content of silicon in the third sub-inorganic encapsulation layer is 0.55 to 0.70.

16. The display device of claim 15, wherein the first sub-inorganic encapsulation layer is directly on the capping layer,
wherein the second sub-inorganic encapsulation layer is directly on the first sub-inorganic encapsulation layer, and wherein the third sub-inorganic encapsulation layer is directly on the second sub-inorganic encapsulation layer.

17. The display device of claim 16, wherein a thickness of the second sub-inorganic encapsulation layer is 3 times to 30 times a thickness of the first sub-inorganic encapsulation layer and/or a thickness of the capping layer,
wherein the thickness of the capping layer is 500 nm to 1,500 nm,
wherein the thickness of the first sub-inorganic encapsulation layer is 500 nm to 1,500 nm,
wherein the thickness of the second sub-inorganic encapsulation layer is 5,000 nm to 15,000 nm, and
wherein a thickness of the third sub-inorganic encapsulation layer is 500 nm to 1,500 nm.

18. A display device comprising:
a substrate;
a light-emitting element on the substrate;
a capping layer on the light-emitting element;
a first inorganic encapsulation layer on the capping layer;
an organic encapsulation layer on the first inorganic encapsulation layer; and
a second inorganic encapsulation layer on the organic encapsulation layer,
wherein the first inorganic encapsulation layer comprises:
a first sub-inorganic encapsulation layer between the capping layer and the organic encapsulation layer; and
a second sub-inorganic encapsulation layer between the first sub-inorganic encapsulation layer and the organic encapsulation layer,
wherein a refractive index of the capping layer is 1.7 to 2.4,
wherein a refractive index of the first sub-inorganic encapsulation layer is 1.3 to 1.62,
wherein a refractive index of the second sub-inorganic encapsulation layer is 1.64 to 1.9,
wherein a change amount of a second color component ($\Delta v'$) and a change amount of a first color component ($\Delta u'$) are 0 at a viewing angle of 0°, and
wherein the change amount of the second color component ($\Delta v'$) has a positive value and the change amount of the first color component ($\Delta u'$) has a negative value at a viewing angle of 60°.

19. The display device of claim 18, wherein the change amount of the first color component ($\Delta u'$) at the viewing angle of 60° is smaller in absolute value than the change amount of the first color component ($\Delta u'$) at a viewing angle of 45°.

20. The display device of claim 19, wherein the change amount of the second color component ($\Delta v'$) at the viewing angle of 60° is smaller in absolute value than the change amount of the second color component ($\Delta v'$) at the viewing angle of 45°.

* * * * *